United States Patent [19]
Silver et al.

[11] Patent Number: 6,127,960
[45] Date of Patent: Oct. 3, 2000

[54] DIRECT DIGITAL DOWNCONVERTER BASED ON AN OSCILLATOR/COUNTER ANALOG-TO-DIGITAL CONVERTER

[75] Inventors: Arnold H. Silver, Rancho Palos Verdes; Dale J. Durand, Irvine, both of Calif.

[73] Assignee: TRW Inc., Redondo Beach, Calif.

[21] Appl. No.: 09/127,020

[22] Filed: Jul. 31, 1998

[51] Int. Cl.[7] .................................................... H03M 1/60
[52] U.S. Cl. ............................................ 341/157; 341/133
[58] Field of Search ..................................... 341/157, 133

[56] References Cited

U.S. PATENT DOCUMENTS

| | | | |
|---|---|---|---|
| 3,678,500 | 7/1972 | Bauer | 340/347 |
| 4,983,971 | 1/1991 | Przybysz et al. | 341/133 |

OTHER PUBLICATIONS

L. R. Eaton, et al., "Design of a 10 K NbN A/D Converter for IR Focal Plane Array Sensors," IEEE Transactions on Applied Superconductivity, 5, 2457 (1995).

*Primary Examiner*—Brian Young
*Assistant Examiner*—Jason Kost
*Attorney, Agent, or Firm*—Michael S. Yatsko

[57] ABSTRACT

A control scheme for operating an oscillator/counter A/D converter (10) so that it simultaneously provides frequency downconversion, band pass filtering and analog-to-digital conversion of an analog signal, where the analog signal includes a carrier wave modulated with information by any known modulation technique. The converter (10) uses a superconducting, Josephson single flux quantum circuit operating as a voltage controlled oscillator (12). The voltage controlled oscillator (12) receives the analog signal to be converted, and generates a series of sharp, high frequency pulses based on the characteristics of the carrier signal. The series of pulses are applied to a gate circuit (14) that either passes or blocks the pulses depending on a gate control signal. When the pulses are passed by the gate circuit (14), a counter circuit (16) accumulates the pulses during a sampling period. The sampling period covers a range of gate control pulses so that the accumulation of pulses defines consecutive on/off periods of the gate control signal. Each time the gate control signal passes the pulses from the variable controlled oscillator (12), the converter (10) effectively performs a bit multiplication that gives the frequency conversion.

21 Claims, 1 Drawing Sheet

DIRECT DIGITAL DOWNCONVERTER BASED ON AN OSCILLATOR/COUNTER ANALOG-TO-DIGITAL CONVERTER

BACKGROUND OF THE INVENTION

1. Field of the Invention

This invention relates generally to a system that converts an analog signal to a digital signal having a lower frequency representation and, more particularly, to an oscillator/counter analog-to-digital converter that simultaneously performs frequency downconversion, band pass filtering and an analog-to-digital conversion of an analog signal using a superconducting, Josephson junction single flux quantum circuit to extract information from a modulated carrier wave in a communications, radar, or other system.

2. Discussion of the Related Art

Various communication systems, such as cellular telephone systems, radar systems, etc., transmit information by modulating a high frequency carrier signal with the information to be transmitted. Different modulation techniques are known in the art, such as amplitude modulation, frequency modulation, phase modulation, etc., that impress information onto a carrier signal to be transmitted. The carrier signal is received by a receiver that removes the carrier signal to separate and decipher the transmitted information. To remove the carrier signal, state of the art receivers typically include an analog mixer or a frequency downconverter that multiplies the received carrier signal with a local oscillator signal to remove the carrier signal and convert the signal to a lower intermediate or baseband frequency. The downconverted frequency signal is then filtered by a pass band filter that passes the frequencies of interest that include the extracted information. The filtered signal is then converted to a digital signal by an analog-to-digital (A/D) converter to provide a digital representation of the information that is subsequently processed by a microprocessor. This general description of the process for extracting information from a carrier signal is well known to those skilled in the art.

Although this type of circuit is successful for extracting transmitted information from a carrier signal, improvements can be made. For example, because these types of communication systems first mix the analog carrier signal to provide the downconversion and then filter the downconverted analog signal before the signal is converted to a digital representation, noise from the various amplifiers and other electrical components in the downconverter and filter decreases the signal-to-noise ratio of the signal and thus degrade the receiver performance. Additionally, it takes several discrete electrical circuits to perform the mixing, filtering and analog-to-digital conversion. Therefore, the communication electronics could benefit from decreased complexity, part count, and power consumption of these circuits.

Alternately, frequency downconversion can be performed digitally. A straight-forward method of digitally performing frequency downconversion is to digitize the carrier signal fast enough to record the carrier directly. In principle, the information on the carrier signal can be extracted from the digital data stream using fast Fourier transform (FFT) routines and other digital signal processing techniques. This type of method stresses the performance of the A/D converter and the digital processor, because it needs to sample the signal fast enough to record the carrier while maintaining a very high dynamic range to avoid degrading the signal and the information bandwidth. Because of this requirement, these systems would require an A/D converter and digital signal processor performance which cannot yet be realized in the state of the art.

A second digital technique, presently used to effectively produce frequency downconversion, is known as intermediate frequency (IF) sampling. In IF sampling a narrow band pass analog filter, centered at the carrier frequency, precedes a standard non-integrating A/D converter. The A/D converter is intentionally operated well below the Nyquist condition for the input signal, generating an alias of the signal which effectively converts the frequency of the information. The presence of the narrow band pass filter removes the ambiguity in original signal frequency usually introduced by aliasing in A/D conversion. This technique is fundamentally different from the present invention. IF sampling is based on instantaneous samples of the signal where the sampling is done on a time scale very short compared to one period of the carrier signal. The present invention is based on an integration of the signal over a time longer than a few periods of the carrier signal. This difference leads to significantly different requirements for the analog signal filter and leads to the much greater flexibility of the present invention.

Oscillator/counter A/D converters that use superconducting, Josephson single flux quantum (SFQ) circuits for converting an analog signal to a digital signal are known in the art. See, for example, L. R. Eaton, et al., "Design of a 10 K NbN A/D Converter for IR Focal Plane Array Sensors," IEEE Transactions on Applied Superconductivity, 5, 2457, (1995). An improvement to the oscillator/counter A/D converter architecture of the type disclosed in the L. R. Eaton et al. article can be found in U.S. Pat. No. 5,942,997, titled Correlated Superconductor Single Flux Quantum Analog-to-Digital Converter, assigned to the assignee of this application, and herein incorporated by reference.

A general depiction of an oscillator/counter A/D converter 10 of the type disclosed in patent application Ser. No. 08/920741 is shown in FIG. 1. The converter 10 includes a voltage controlled oscillator (VCO) 12, a digital gate circuit 14 and a digital pulse counter circuit 16. Each of the VCO 12, the gate circuit 14 and the counter circuit 16 are general representations of known electrical circuits that perform the functions described herein. The analog carrier signal is received by an antenna (not shown) and is applied to the VCO 12. The VCO 12 converts the analog signal to a series of high frequency SFQ pulses having a pulse frequency proportional to the voltage potential of the analog signal applied to the VCO 12. The VCO 12 uses multiple Josephson Junctions within a direct current superconducting quantum interface device (SQUID) to convert the analog signal to the series of SFQ pulses. The repetition rate of the pulses from the VCO 12 is dependent on the amplitude of the carrier signal and the information modulated thereon. In other words, the VCO 12 will output the pulses at a certain pulse rate depending on the characteristics of the modulated carrier signal. Typically, the pulse rate of the output of the VCO 12 will be much greater than the frequency of the carrier signal.

A control signal is applied to the gate circuit 14 such that when the control signal is high, the gate circuit 14 will pass the pulses from the VCO 12. When the gate circuit 14 passes the pulses from the VCO 12, the counter circuit 16 accumulates and counts the pulses to give a digital representation of the analog input signal to the VCO 12. In one embodiment, the counter circuit 16 is a single flux quantum counter comprising a chain of flip-flops which operate asynchronously to accumulate the total number of pulses from the VCO 12. The total count of the pulses from the VCO 12 during the time that the control signal to the gate circuit 14 is high is the digital representation of the analog signal integrated over the sample time. The state-of-the-art oscillator/counter A/D converter resets the counter circuit 16 to zero before each sample time. In other words, each time the control signal applied to the gate circuit 14 goes low, the counter circuit 16 is reset, so that the sample period is the length of time that one gate pulse is high.

It is an object of the present invention to control the operation of the oscillator/counter A/D converter 10 so that not only does the converter 10 give a digital representation of the analog input signal, but simultaneously performs frequency downconversion and band pass filtering of the signal. Such a control scheme can be used to replace the existing circuitry in communication systems that perform frequency downconversion, low pass filtering and analog-to-digital conversion, and thus, improve performance, decrease complexity, part count and power consumption, and increase the flexibility of the downconversion function.

SUMMARY OF THE INVENTION

In accordance with the teachings of the present invention, a control scheme is provided to operate an oscillator/counter A/D converter so that it simultaneously provides frequency downconversion, band pass filtering and analog-to-digital conversion of an analog signal, where the analog signal includes a carrier wave modulated with information by any known modulation technique. In one embodiment, the converter uses a superconducting, Josephson junction single flux quantum circuit operating as a voltage controlled oscillator (VCO). The VCO receives the analog signal to be converted, and generates a series of sharp, high frequency pulses where repetition frequency is based on the characteristics of the carrier signal. The series of pulses are applied to a gate circuit that either passes or blocks the pulses depending on a gate control signal. When the pulses are passed by the gate circuit, a counter circuit accumulates the pulses during a sampling period. The sampling period covers a range of gate control pulses, so that the accumulation of pulses includes consecutive on/off periods of the gate control signal. Passing and blocking pulses is equivalent to multiplication of the SFQ pulse train by one and zero, respectively. This multiplication leads to the frequency conversion. This operation produces an analog-to-digital conversion that is equivalent to the conversion of a non-integrating analog-to-digital converter following a mixer and a low pass filter.

Additional objects, advantages, and features of the present invention will become apparent from the following description and appended claims, taken in conjunction with the accompanying drawings.

DETAILED DESCRIPTION OF THE PREFERRED EMBODIMENTS

The following description of the preferred embodiments directed to a control scheme for causing an oscillator/counter A/D converter to perform frequency downconversion, is merely exemplary in nature, and is in no way intended to limit the invention or its applications or uses.

Figure 1:
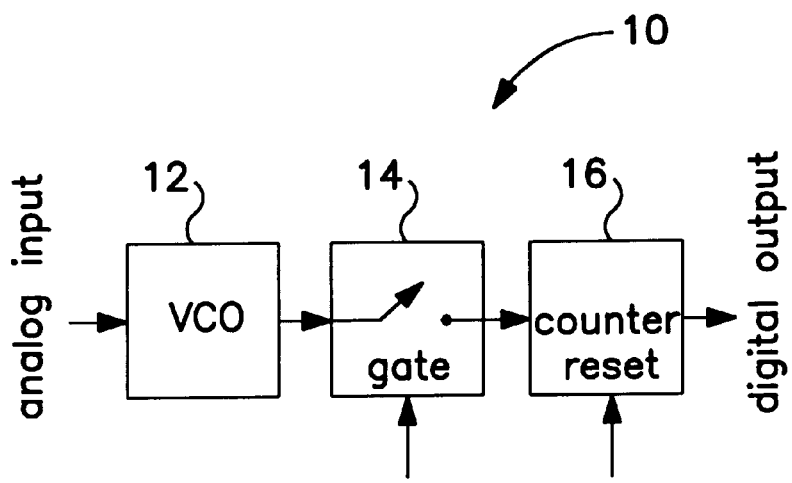
FIG. 1 is a block schematic diagram of an oscillator/counter A/D converter known in the art.

As mentioned above, the converter 10 has been used in the prior art to provide a digital representation of an analog signal. Operation of the known converters of the type depicted in FIG. 1 typically reset the counter circuit 16 after each control pulse is applied to the gate circuit 14 to pass the SFQ pulses, so that the sample period of the counter circuit 16 is based on a single control pulse applied to the gate circuit 14, regardless of the length of that control pulse. In other words, the sample time of when the counter circuit 16 is accumulating the high frequency pulses from the VCO 12 is only one period during which the gate control signal allows the pulses to pass the gate circuit 14. In the known converter, once the control signal applied to the gate circuit 14 causes the gate circuit 14 to block the SFQ pulses from the VCO 12, the counter circuit 16 is reset and the accumulation of the pulses is output from the counter circuit 16. The present invention proposes extending the use of the converter 10 to also provide frequency downconversion and band pass filtering, in combination with the analog-to-digital conversion, to provide these functions in a communications or radar system. Thus, the circuitry to perform at least these three functions can be provided on a single integrated circuit chip.

In general, the frequency downconversion and band pass filtering functions are provided by extending the accumulation time of the counter circuit 16 to cover a series of control pulses applied to the gate circuit 14. According to one embodiment, the gate circuit 14 is repetitively opened and closed many times in a single sample period before resetting the counter circuit 16. The pulse counter circuit 16 accumulates the total number of pulses over several consecutive open and closed periods of the gate circuit 14. This operation produces an A/D converter reading that is equivalent to the reading of a conventional A/D converter following a mixer and a band pass filter.

Figure 2:
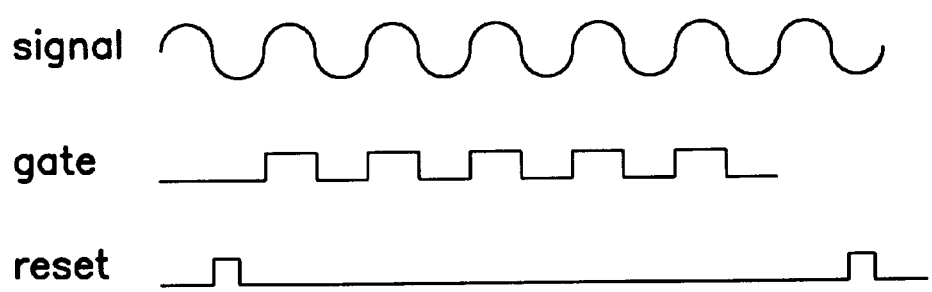
FIG. 2 is a timing diagram for controlling the converter shown in FIG. 1, according to one embodiment of the invention.

FIG. 2 shows an example of a timing diagram that controls the operation of the converter 10 as a digital frequency downconverter according to the invention. The signal line represents the analog input carrier wave applied to the VCO 12. Although not specifically shown, the carrier wave would be modulated by some known modulation format, such as amplitude modulation or frequency modulation. The output of the VCO 12 would be a series of short pulses having a frequency greater than the carrier signal. The gate line is a gate control signal that is typically a series of square wave pulses, where the pulses are high half of the time and low the other half of the time. The gate circuit 14 is closed to pass the SFQ pulses when the control signal is high. To demodulate an AM signal, high pulses of the gate signal are aligned with the positive cycles of the carrier signal, so that the gate circuit 14 acts as a rectifier passing only the information on the positive portion of the carrier wave signal. The reset line is a periodic reset signal that is applied to the counter circuit 16 to reset it. The reset period satisfies the Nyquist condition of the information bandwidth of the signal applied to the VCO 12. The total count of the accumulation of the SFQ pulses from the VCO 12 during the time that the gate circuit 14 is passing the pulses is the digital representation of the signal applied to the VCO 12, integrated over the sampling period between the reset pulses. The counter circuit 16 acts like a low pass filter, and provides a digital output representation of the analog input signal between the pulses of the reset signal.

As is apparent, there are several gate control pulses between the two reset pulses. Many SFQ pulses pass through the gate circuit 14 when the gate signal is high. The converter 10 performs the frequency downconversion because the on/off cycling of the gate control signal mathematically performs a one-bit multiplication of the SFQ pulses representing the analog signal applied to the VCO 12. In other words, the opening and closing of the gate circuit 14 multiplies the SFQ pulses by a digital one or zero, so that the information is effectively converted to another frequency. The rate and width of the gate control signal, and the frequency of the reset signal, would be designed for each particular application by considering the frequency and modulation of the carrier signal, and the information to be extracted. By controlling the rate and width of the gate control signal, the converter 10 has a high degree of flexibility for converting the analog signal to different frequency representations.

FIG. 2 shows a representation of the invention where the gate control signal is only activated between the reset pulses. The period between reset pulses defines the time and number of gate control pulses that control the accumulation of the SFQ pulses by the counter circuit 16. In this depiction, the gate control signal has a 50% duty cycle, and the reset period represents the time that the counter circuit 16 accumulate counts. Of course, a gate control signal having a 50% duty cycle is by way of a non-limiting example, and is shown for simplicity.

In the limit of low quantization noise, equivalently in the limit of high VCO frequency, the number of pulses counted between reset pulses is the integral of the product of the gate circuit control signal and the input analog signal, where the gate control signal is equal to one when it is in the state to pass pulses from the VCO 12 to the counter circuit 16, and equal to zero when it is in the state to block these pulses. This is equal to the integral, or sum, of the product of the analog signal and the gate signal, as shown in FIG. 2. ADC is the digital signal from the converter 10, and is defined as:

$$ADC = \int_{-\infty}^{+\infty} signal \times gate \quad (1)$$

The gate circuit control signal may be constructed from the product of two functions, a continuously periodic square wave having a 50% duty cycle, and a single window pulse. The periodic square wave has a fundamental frequency equal to the gate frequency $f_{gate}$. In this situation with the timing displayed in FIG. 2, the integrated product of Equation 1 is effectively half-wave digital rectification of the analog signal, whose short-term value has a DC component and the amplitude modulation signal. Higher harmonics of the carrier and other mixing frequencies will be filtered by the integration process in the counter. To recover frequency or phase modulation, the relative time-phasing of the carrier and gate signal in FIG. 2 is shifted by 90 degrees. If the gate and carrier frequencies are different, these same processes will generate a modulated intermediate frequency similar to the conventional analog RF method.

The above description of the invention with respect to FIG. 2 and equation (1) is a general depiction of the operation of the invention. The control of the converter 10, according to the invention, would be more detailed for a practical implementation. The proposed invention provides an elegant technique for simultaneously performing analog-to-digital conversion, frequency conversion and band pass filtering in a less complex system than is known in the prior art, and at a reduced power consumption. The system described herein has an extended use in many types of communication and radar systems, and provides significant improvements over the known systems, such as microwave mixers or intermediate frequency (IF) sampling.

The foregoing discussion discloses and describes merely exemplary embodiments of the present invention. One skilled in the art will readily recognize from such discussion, and from the accompanying drawings and claims, that various, changes, modifications and variations can be made therein without departing from the spirit and scope of the invention as defined in the following claims.

What is claimed is:

1. A method of converting an analog input signal to a digital output signal, said method comprising the steps of:
   converting the analog input signal to a series of pulses;
   alternately blocking and passing the pulses at a predetermined control rate; and
   accumulating the series of pulses that are passed where the accumulation of pulses defines the digital output signal, wherein each separate sampling period that accumulates the series of pulses includes an accumulation of pulses over a plurality of consecutive on and off times of the blocking and passing of the pulses.

2. The method according to claim 1 wherein the step of converting the analog input signal to a series of pulses includes using a voltage controlled oscillator.

3. The method according to claim 2 wherein the voltage controlled oscillator includes a superconducting quantum interface device including multiple Josephson Junctions.

4. The method according to claim 1 wherein the step of accumulating the series of pulses includes accumulating the series of pulses by a digital counter.

5. The method according to claim 4 wherein the digital counter is a single flux quantum counter.

6. The method according to claim 1 wherein the step of alternately blocking and passing the pulses includes providing a digital gate that receives a gate control signal that is a series of alternating square wave pulses, wherein the series of pulses is passed when the gate control signal pulses are high.

7. The method according to claim 1 wherein the gate control signal has a 50% duty cycle.

8. The method according to claim 1 wherein the step of converting the analog input signal to a series of pulses includes converting the analog input signal to a series of pulses having a higher frequency than the analog signal.

9. The method according to claim 1 wherein the series of pulses has a frequency proportional to the amplitude of the analog signal.

10. The method according to claim 1 wherein the digital output signal is a digital representation of the analog input signal that has been frequency converted and band pass filtered.

11. A method of converting an analog input signal to a digital output signal where the digital output signal is a frequency conversion representation of the input signal, said method comprising the steps of:
   providing an oscillator circuit that receives the analog input signal and converts the analog input signal to a series of oscillator pulses that have a frequency proportional to the characteristics of the analog input signal;
   providing a digital gate that receives the series of oscillator pulses;
   applying a gate control signal to the digital gate where the control signal is a series of control pulses that alternately block and pass the series of oscillator pulses based on the duty cycle of the control signal;

providing a digital counter that accumulates the series of oscillator pulses that are passed by the digital gate, wherein the accumulation of pulses defines the digital output signal; and applying a reset signal to the digital counter to define a predetermined sampling period that provides an initiation of a new accumulation of the series of oscillator pulses, said sampling period covering a plurality of consecutive control pulses of the control signal.

12. The method according to claim 11 wherein the oscillator circuit, the digital gate and the digital counter combine to be an oscillator/counter analog-to-digital converter.

13. The method according to claim 11 wherein the oscillator is a superconducting quantum interface device that includes multiple Josephson Junctions.

14. The method according to claim 11 wherein the frequency of the series of oscillator pulses from the oscillator circuit is greater than the frequency of the analog signal.

15. The method according to claim 11 wherein the gate control signal is a series of square wave pulses having a 50% duty cycle.

16. The method according to claim 11 wherein the digital counter is a single flux quantum counter.

17. The method according to claim 11 wherein the digital output signal is a digital representation of the analog input signal that has been frequency downconverted and bandpass filtered.

18. A system for converting an analog input signal to a digital output signal where the digital output signal is a frequency conversion representation of the input signal, said system comprising:

an oscillator circuit responsive to the analog input signal, said oscillator circuit converting the analog input signal to a series of oscillator pulses that have a frequency proportional to the characteristics of the analog input signal;

a digital gate responsive to the series of oscillator pulses from the oscillator circuit, said digital gate also being responsive to a gate control signal where the gate control is a series of control pulses that alternately block and pass the series of oscillator pulses based on the duty cycle of the control signal; and a digital counter responsive to the series of oscillator pulses that are passed by the gate circuit, said digital counter accumulating the series of oscillator pulses where the accumulation of pulses define digital output signals, said digital counter further being responsive to a reset signal that resets the digital counter to provide an initiation of a new accumulation of the series of oscillator pulses and define a predetermined sample, said sampling period covering a plurality of consecutive control pulses of the control signal.

19. The system according to claim 18 wherein the oscillator circuit is a superconducting quantum interface device that includes multiple Josephson Junctions.

20. The system according to claim 18 wherein the gate control signal is a series of square wave pulses having a 50% duty cycle.

21. The system according to claim 18 wherein the digital counter is a single flux quantum counter.

* * * * *